(12) United States Patent  
Miyaguchi

(10) Patent No.: US 6,506,088 B2  
(45) Date of Patent: Jan. 14, 2003

(54) METHOD OF MANUFACTURING ORGANIC ELECTROLUMINESCENCE ELEMENT

(75) Inventor: Satoshi Miyaguchi, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 5 days.

(21) Appl. No.: 09/907,938

(22) Filed: Jul. 19, 2001

(65) Prior Publication Data

US 2002/0014835 A1 Feb. 7, 2002

Related U.S. Application Data

(62) Division of application No. 09/388,537, filed on Sep. 2, 1999, now Pat. No. 6,297,588.

(30) Foreign Application Priority Data

Sep. 10, 1998 (JP) ............................................. 10-256725

(51) Int. Cl.$^7$ ................................................ H05B 33/10
(52) U.S. Cl. ......................................................... 445/24
(58) Field of Search ........................................... 445/24

Primary Examiner—Kenneth J. Ramsey  
(74) Attorney, Agent, or Firm—Sughrue Mion, PLLC

(57) ABSTRACT

An organic electroluminescence element includes a substrate carrying a transparent electrode; a plurality of organic functional layers including an organic light-emitting layer deposited on the transparent electrode; and a metal electrode over the organic functional layers. A part of the organic functional layers covering any foreign body is melted, regardless of whether or not the foreign body has been on the transparent electrode so that the melted part of the organic functional layer on the foreign body is merged into the organic functional layer stacked on the transparent electrode around the foreign body, so as to enclose the solid foreign body in the organic functional layer.

3 Claims, 2 Drawing Sheets

EMISSION

METHOD OF MANUFACTURING ORGANIC ELECTROLUMINESCENCE ELEMENT

This is a divisional of application Ser. No. 09/388,537 filed Sep. 2, 1999, now U.S. Pat. No. 6,297,588 disclosure of which is incorporated herein by reference.

BACKGROUND OF THE INVENTION

1. Field of the Invention

The present invention relates to an organic electroluminescence element (also referred to as "organic EL element" hereinafter) utilizing an organic compound material which exhibits an electroluminescence phenomenon, i.e., emission of light resulting from injection of an electric current into the organic material and to a method of manufacturing the same.

The present invention also relates to an organic electroluminescence display device (also referred to as "organic EL display device" hereinafter) comprising a plurality of organic EL elements.

2. Description of the Related Art

In recent years, much attention has been focused on the organic EL display device with a flat display panel on which many organic EL elements each comprising an organic light-emitting layer made of an organic material are arranged. In general, as shown in FIG. 1, each organic EL element 1 has such a structure that a transparent electrode 3 (anode) made of indium tin oxide (so called ITO), a plurality of organic functional layers 4 made of respective organic materials and including the organic light-emitting layer, and a metal electrode 5 (cathode) are sequentially laminated on a glass substrate 2 serving as a display surface, by vapor deposition or the like. The organic functional layers 4 may include a hole injection layer, a hole transport layer, an electron transport layer and the like if necessary in addition to the organic light-emitting layer. The hole injection layer is made of an organic material capable of injecting positive holes into the hole transport layer. The hole transport layer is made of an organic material capable of transporting positive holes into the organic light-emitting layer. The electron transport layer is made of an organic material capable of transporting electrons into the organic light-emitting layer. For example, there is an EL display device of the X-Y matrix type in which EL elements are manufactured in such a manner that the hole transport layer and the organic light-emitting layer are deposited in that order on ITO stripes of transparent electrodes (anode lines) previously formed on a transparent glass substrate and then a plurality of metal electrodes (cathode lines) are formed on the organic light-emitting layer so as to cross the ITO stripes on two levels. The respective EL elements at intersections between the anodes and cathodes form a matrix of light-emitting points corresponding to pixels. In addition to the EL element with a two-layered structure composed of the hole transport layer and the organic light-emitting layer above mentioned, there are other EL element types such as a three-layered structure having an organic electron transport layer additionally provided between the organic light-emitting layer and the metal electrodes, and a multiple-layered EL element type formed of still more layers.

Since the vapor depositions of the individual layers on the glass substrate are preformed for making the organic EL element, for example as shown in FIG. 2, if dust or a solid foreign body 6 lies on the anode 3 at the time of depositing those layers, the foreign body makes it hard for the following vapor particles to be vapor-deposited around the underlying contact on the anode. It is therefore probable that an organic functional layer 4 tends to be thinner at the peripheral portion of the area underlying the foreign body than at the other areas. As a result, the anode 3 and a cathode 5 to be stacked later come closer to each other in the vicinity of the foreign body 6, thereby causing concentration of an electric field which will change the luminance of the emitted light. In some case, the anode 3 may come into contact with the cathode 5 thereby causing short-circuiting, which may produce non-luminous areas called "dark spots" or may damage the EL element per se.

One countermeasure that has been taken against this problem is to clean the substrate upon deposition of each layer. However, this method alone is hardly possible to completely remove a foreign body once it is stuck on any layer.

SUMMARY OF THE INVENTION

The present invention has been made in view of the above circumstances, and an object thereof is to provide a reliable EL element in which the possibility of a short circuit or leak current between the transparent electrode anode and the metal electrode cathode is reduced.

To attain the above object, the present invention provides an organic EL element comprises:
- a substrate carrying a transparent electrode;
- a plurality of organic functional layers including an organic light-emitting layer deposited on the transparent electrode, wherein a part of at least one of the organic functional layers which is heaped on a solid foreign body is melted, regardless of whether or not the solid foreign body has been on the transparent electrode, so that the melted part of the organic functional layer on the solid foreign body is merged into the organic functional layer stacked on the transparent electrode around the solid foreign body, thereby burying the solid foreign body in the organic functional layer; and
- a metal electrode over the organic functional layers.

In the organic EL element according to the invention, the melting of the part of the organic functional layer covering the solid foreign body is performed in a way that the whole substrate is heated to a temperature equal to or higher than a glass transition point of the organic functional layer and equal to or lower than a melting point thereof.

To attain the above object, the present invention also provides a method of manufacturing an organic EL element having a plurality of organic functional layers including an organic light-emitting layer sandwiched between a pair of electrodes, which method comprises the steps of:
- depositing a first organic functional layer over a transparent electrode previously formed on a light permeable substrate;
- melting a part of the first organic functional layer which is heaped on a solid foreign body, regardless of whether or not the solid foreign body has been on the transparent electrode prior to the first organic functional layer forming step, so that the melted part of the first organic functional layer on the solid foreign body is merged into the first organic functional layer stacked on the transparent electrode around the solid foreign body, thereby burying the solid foreign body in the first organic functional layer;
- depositing a second organic functional layer on the first organic functional layer; and
- forming a metal electrode over the second organic functional layer.

In the method of manufacturing an organic EL element according to the invention, the step of melting the part of the organic functional layer covering the solid foreign body is performed in a way that the whole substrate is heated to a temperature equal to or higher than a glass transition point of the organic functional layer and equal to or lower than a melting point thereof.

In the method of manufacturing an organic EL element according to the invention, the organic functional layers and the metal electrode are formed through a vapor deposition method.

According to the EL display device having the above construction, even if dust or a solid foreign body is inadvertently introduced during the manufacturing process of the organic EL element, the foreign body is always enclosed by organic material i.e., an organic functional layer, so that the transparent electrode and metal electrode of the organic EL element are always set apart at a predetermined distance from each other, thus preventing the transparent electrode and the metal electrode from coming close to or contacting each other. Even if a foreign body is adhered to the transparent electrode, it is possible to prevent generation of a leak current between the transparent electrode and the metal electrode thereby preventing reduction in the luminance of light emitted from each organic EL element and preventing the organic EL elements from being damaged.

DETAILED DESCRIPTION OF THE PREFERRED EMBODIMENTS

An organic EL element and a method of manufacturing the same according to an embodiment of the present invention will be described in more detail with reference to the accompanying drawings.

Figure 1:
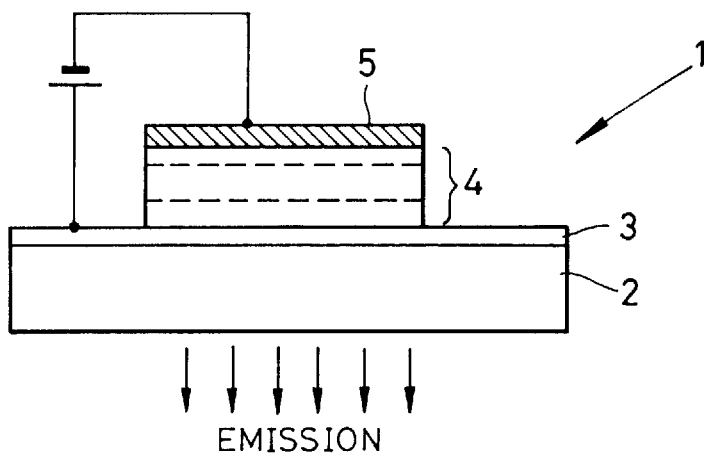
FIG. 1 is an enlarged sectional view schematically showing an organic EL element.
Figure 2:
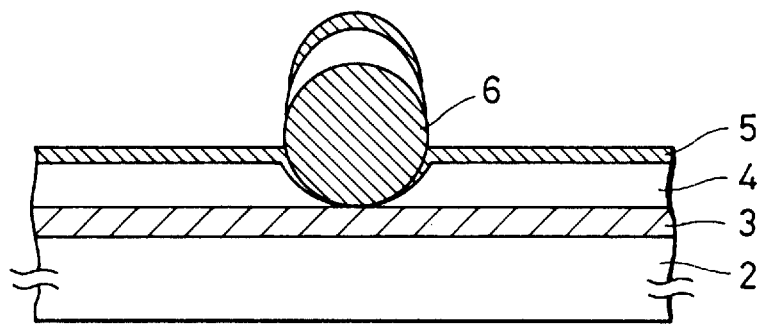
FIG. 2 is an enlarged sectional view schematically illustrating a substrate in a step of manufacturing a conventional organic EL element.
Figure 3:
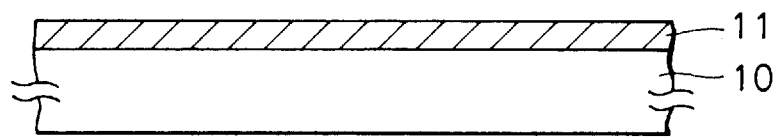
FIGS. 3 to 7 are enlarged sectional views schematically each showing a substrate in a step of manufacturing an organic EL element according to an embodiment of the present invention.

Referring first to FIG. 3, there is shown a substrate 10 on which an EL element is formed. First, ITO is patterned on the transparent substrate 10, made of glass or the like, as transparent electrodes 11 in parallel to one another at predetermined intervals, by a vapor deposition method or the like.

Figure 4:
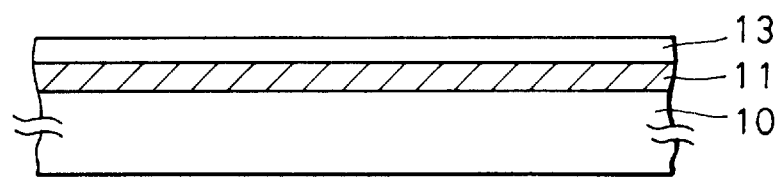

Next, as shown in FIG. 4, an organic functional layer of Copper phthalocyanine or Cu—Pc is vapor-deposited on the ITO transparent electrodes 11 as a hole injection layer 13.

Figure 5:
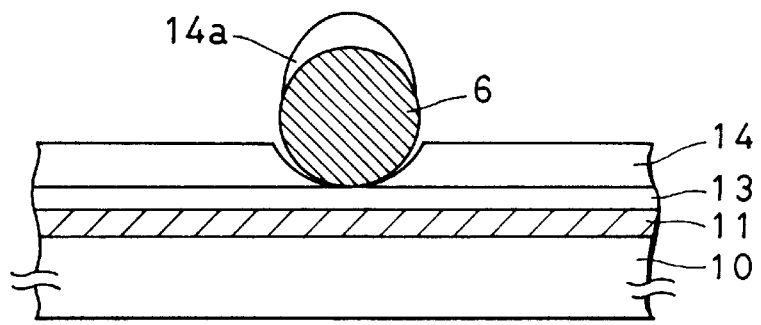

Then, as shown in FIG. 5, a triphenyldiamine-based compound e.g., N,N'-diphenyl-N-N'-bis(3-methylphenyl)-1, 1'-biphenyl-4,4'-diamine (hereinafter referred as "TPD") is vapor-deposited on the hole injection layer 13 as a hole transport layer 14. The hole transport layer 14 may be formed of 4,4',4"-tris[N-(3-methylphenyl)-N-phenylamino] triphenylamine (so called "MTDATA") instead of TPD. Alternatively, the organic EL element may be structured in such a way that a hole transport layer 14 is formed on the ITO anode 11 without forming hole injection layer.

Figure 6:
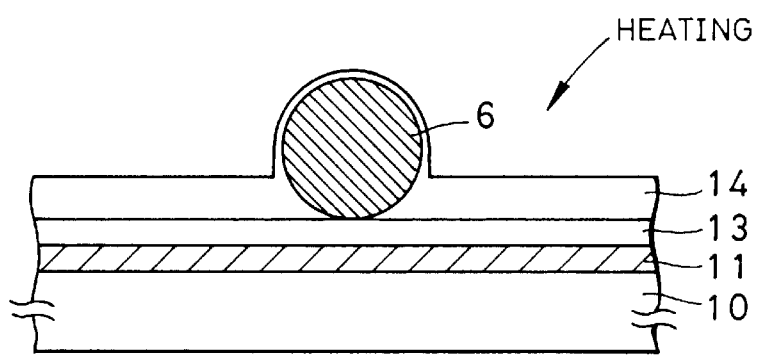

Subsequently, as shown in FIG. 6, the whole substrate 10 is heated to a temperature equal to or higher than the glass transition point of the hole transport layer of TPD 14 and equal to or lower than the melting point thereof. The heating step is preformed for melting a part of the hole transport layer 14a deposited on a solid foreign body 6, even if lies the foreign body on any transparent electrode 11 or the hole injection layer 13, and causes the now melted organic material fluid 14a to merge, due to gravity and surface tension, with the hole transport layer 14 formed on the transparent electrode. This process encapsulates the foreign body 6 in the hole transport layer 14. As a result, the hole transport layer 14 is contiguously formed without a break or gap due to the foreign body 6. With the material of the hole transport layer 14 having a glass transition point of 95° C., for example, the melting temperature is about 150° C. and the heating time is approximately 5 minutes. It is to be noted that a halide lamp may serve as a heater for heating the whole substrate under reduced pressure or in a vacuum chamber.

Figure 7:
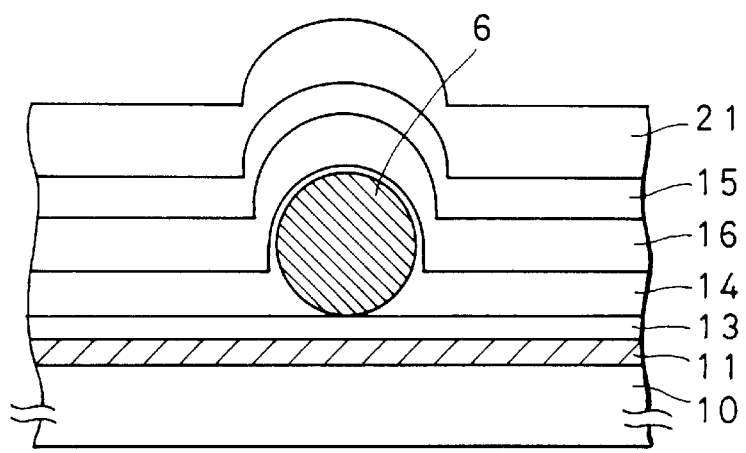

Next, as shown in FIG. 7, for example, tris(8-hydroxyquinoline) aluminum complex or Alq3 is vapor-deposited as an organic light-emitting layer 16 on the hole transport layer 14. Then, $Li_2O$ is vapor-deposited as an electron-injecting layer 15 on the organic light-emitting layer 16. Subsequently, aluminum Al is vapor deposited as a metal electrode 21 on the electron-injecting layer 15 in such a manner that the metal electrode 21 perpendicularly intersects the transparent electrode 11 via the organic functional layers on the substrate. In this way, a display panel comprising organic EL elements is prepared.

It is also possible to form an electron transport layer between the organic light-emitting layer and the electron-injecting layer, as an additional organic functional layer.

According to the invention, by heating the whole substrate to a temperature equal to or higher than the glass transition point of at least of the organic functional layers on the ITO electrode and equal to or lower than the melting point of the at least of the organic functional layers, even if the foreign body 6 is introduced during the vapor-deposition for layers, the foreign body is covered with an organic material of the hole transport layer and/or electron transport layer, so that the transparent electrode 11 and metal electrode 21 of an organic EL element are set apart at a given distance from each other, thus preventing the transparent electrode layer and the metal electrode layer from coming close to or contacting each other. When a foreign body is adhered to the transparent electrode, it is possible to prevent generation of a leak current between the transparent electrode 11 and the metal electrode 21 to be formed later, thereby preventing reduction in the luminance of light emitted from each organic EL element and preventing the individual organic EL elements of a display panel from being damaged.

What is claimed is:

1. A method of manufacturing an organic electroluminescence element having a plurality of organic functional layers including an organic light-emitting layer sandwiched between a pair of electrodes, which method comprises the steps of:

depositing a first organic functional layer over a transparent electrode previously formed on a light permiable substrate;

melting a part of the first organic functional layer so as to enclose any foreign body therein so that the melted part of the first organic functional layer on the foreign body is merged into the first organic functional layer stacked on the transparent electrode around the foreign body, thereby enclosing the foreign body in the first organic functional layer;

depositing a second organic functional layer on the first organic functional layer; and forming a metal electrode over the second organic functional layer.

2. A method of manufacturing an organic electroluminescence display device according to claim 1 comprising, performing the step of melting the part of the first organic functional layer covering the foreign body so that the whole substrate is heated to a temperature equal to or higher than a glass transition point of the first organic functional layer and equal to or lower than a melting point thereof.

3. A method of manufacturing an organic electroluminescence display device according to claim 2, comprising forming the organic functional layers and the metal electrode by vapor deposition.

* * * * *